(12) United States Patent
Kim et al.

(10) Patent No.: US 7,454,670 B2
(45) Date of Patent: Nov. 18, 2008

(54) DATA MANAGEMENT APPARATUS AND METHOD OF FLASH MEMORY

(75) Inventors: Jin-hyuk Kim, Seoul (KR); Hyun-mo Chung, Gyeonggi-do (KR); Sung-ju Myoung, Gyeonggi-do (KR); Jae-wook Cheong, Seoul (KR); Chan-ik Park, Seoul (KR); Tae-sun Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 11/043,214

(22) Filed: Jan. 27, 2005

(65) Prior Publication Data

US 2005/0162947 A1 Jul. 28, 2005

(30) Foreign Application Priority Data

Jan. 27, 2004 (KR) .................. 10-2004-0005020

(51) Int. Cl.
*G11C 29/00* (2006.01)
(52) U.S. Cl. ..................................... 714/710
(58) Field of Classification Search ............... 714/710, 714/718, 723, 735, 736; 711/157, 154, 149, 711/206, 147, 5, 103, 202, 209; 365/185.33, 365/185.09, 32, 200, 201
See application file for complete search history.

(56) References Cited

U.S. PATENT DOCUMENTS

| | | | | |
|---|---|---|---|---|
| 5,907,856 A | * | 5/1999 | Estakhri et al. | 711/103 |
| 5,930,815 A | * | 7/1999 | Estakhri et al. | 711/103 |
| 6,000,006 A | * | 12/1999 | Bruce et al. | 711/103 |
| 6,081,878 A | * | 6/2000 | Estakhri et al. | 711/168 |
| 6,161,195 A | * | 12/2000 | Konishi et al. | 714/7 |
| 6,397,314 B1 | * | 5/2002 | Estakhri et al. | 711/168 |
| 6,728,851 B1 | * | 4/2004 | Estakhri et al. | 711/168 |
| 6,772,274 B1 | * | 8/2004 | Estakhri | 711/103 |
| 7,007,140 B2 | * | 2/2006 | Yoshii et al. | 711/154 |
| 2002/0181285 A1 | | 12/2002 | Hirosawa | |
| 2003/0161199 A1 | * | 8/2003 | Estakhri | 365/200 |
| 2004/0255089 A1 | * | 12/2004 | Unno | 711/154 |
| 2006/0195651 A1 | * | 8/2006 | Estakhri et al. | 711/103 |

FOREIGN PATENT DOCUMENTS

| | | |
|---|---|---|
| CN | 1437721 A | 8/2003 |
| JP | 7-29392 A | 1/1995 |
| KR | 1999-0055972 A | 7/1999 |

OTHER PUBLICATIONS

European Search Report, Application No. EP 05 25 0205, dated Jun. 26, 2007.

* cited by examiner

*Primary Examiner*—Phung M Chung
(74) *Attorney, Agent, or Firm*—Sughrue Mion, PLLC

(57) ABSTRACT

A data management apparatus and method used in a system using one or more flash memories, which can deal with defective blocks in each of the flash memories using different methods depending on how the system manages data stored in each of the flash memories. The data management apparatus includes a device driver, which controls the operation of one or more flash memories, and a controller, which transfers data stored in a defective block of one of the flash memories to a predetermined block in the flash memory.

17 Claims, 18 Drawing Sheets

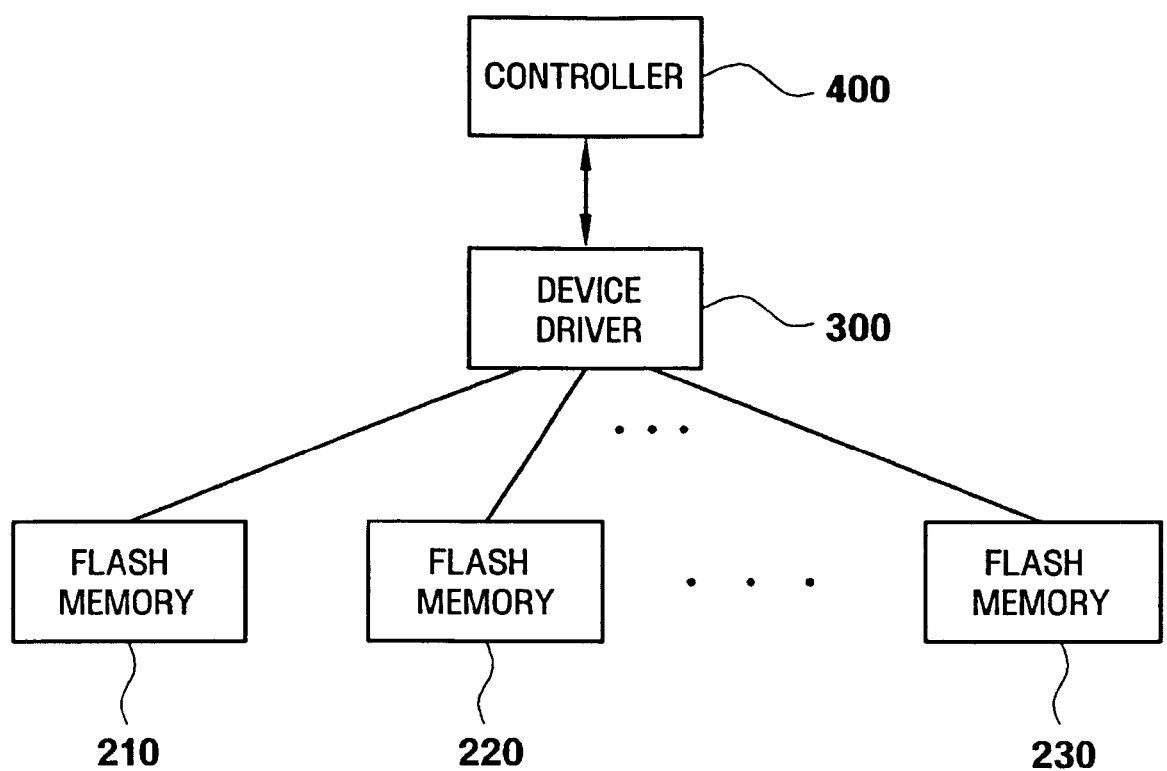

FIG. 14A

| SPARE AREA | DEFECTIVE BLOCK |
|---|---|
| 10 | 130 |
| 12 | 500 |

FIG. 14B

| SPARE AREA | DEFECTIVE BLOCK |
|---|---|
| 0 | 130 |
| 1 | -1 |
| 2 | 500 |

DATA MANAGEMENT APPARATUS AND METHOD OF FLASH MEMORY

CROSS-REFERENCE TO RELATED APPLICATION

This application claims priority from Korean Patent Application No. 10-2004-0005020 filed on Jan. 27, 2004 in the Korean Intellectual Property Office, the disclosure of which is incorporated herein by reference in its entirety.

BACKGROUND OF THE INVENTION

1. Field of the Invention

The present invention relates to a data management apparatus and method for use in a flash memory, and more particularly, to a data management apparatus and method for use in a flash memory, which can deal with defective blocks in each flash memory in a system using at least one flash memory by taking into consideration how the system processes data stored in each flash memory.

2. Description of the Related Art

In general, home appliances, communications devices, and embedded systems, such as set-top boxes, use non-volatile memories as storage devices for storing and processing data.

Flash memories are one type of non-volatile memory, in which data can be electrically erased and overwritten. Flash memories are suitable for portable devices because they consume less power than magnetic disc memory-based storage mediums, are as accessible as hard discs, and are compact-sized.

Due to the hardware characteristics of flash memories, data recorded on a flash memory should be erased before data is overwritten on the flash memory.

A unit in which data is recorded on a flash memory may differ from a unit in which data is erased from the flash memory, which may result in deterioration of the performance of the flash memory.

In order to prevent the performance of the flash memory from deteriorating for this reason, logical addresses and physical addresses have been suggested. Logical addresses are virtual addresses specified by a user when executing a data operation on the flash memory with the use of a program. By comparison, physical addresses are actual addresses referenced when executing the data operation on the flash memory.

Flash memory is generally classified into either a small block flash memory or a large block flash memory. In a small block flash memory, a logical operation unit is equal to a physical operation unit, whereas in a large block flash memory, a logical operation unit is smaller than a physical operation unit.

In other words, supposing that the logical operation unit and physical operation unit of the flash memory are respectively referred to as a sector and a page, a sector and a page of the small block flash memory are identical, but a page of the large block flash memory is a predetermined number of times larger than a sector of the large block flash memory.

Data can be erased from a flash memory only a limited number of times. If data is erased from some of a plurality of blocks of the flash memory more than a maximum number of times that data can be erased from the flash memory, or if some of the blocks of the flash memory, from which data is erased almost as many times as the maximum number, are fragile for some reason, the corresponding blocks may become defective.

Defective blocks of the flash memory are categorized into initial defective blocks, which are defective blocks detected before the flash memory is shipped out of the factory, or run-time defective blocks, which are defective blocks generated by a user during executing a data operation on the flash memory.

All of the blocks of the flash memory may become defective, and defective blocks of the flash memory considerably affect the performance of the flash memory. Thus, various methods to efficiently deal with the defective blocks of the flash memory have been developed.

FIG. 1 is a schematic diagram illustrating the structure of a typical flash memory. Referring to FIG. 1, the typical flash memory includes a defective block management area 10, in which defective blocks of the typical flash memory are dealt with, and a data area 20, in which data computations are executed.

Specifically, the defective block management area 10 includes a defective block information area 11, which includes mapping information on the defective blocks of the typical flash memory, and a spare area 12, which provides substitute blocks that respectively replace the defective blocks of the typical flash memory.

Here, the mapping information on the defective blocks of the typical flash memory is realized as a mapping table that respectively maps the defective blocks of the typical flash memory with the substitute blocks in the spare area 12.

A conventional data management method using the defective block management area 10 will now be described. As shown in FIG. 2, in operation S11, it is determined whether there is an indication that a predetermined or current block of the typical flash memory is an initial defective block.

In operation S12, it is determined whether the predetermined block is an initial defective block based on the determination results obtained in operation S 11.

In operation S13, if the predetermined block is an initial defective block, the predetermined block of the flash memory is replaced with a normal block, specifically, a substitute block in the spare area 12, by referencing the mapping table.

Accordingly, a data operation, which is supposed to be performed on the predetermined block, can be performed on the substitute block that replaces the predetermined block.

In operation S14, it is determined if all blocks in the flash memory are subjected to defective block determination. If the predetermined block is not the last one, the iteration is initiated in operation S15 so that operations S11 through S14 can be performed on a block subsequent to the predetermined block.

If a defect occurs while performing the data operation on a block of the flash memory that has already been determined non-defective through operations S11 through S14, the corresponding block is determined to be a run-time defective block.

A conventional data management method for dealing with run-time defective blocks of a typical flash memory is illustrated in FIG. 3. Referring to FIG. 3, in operation S21, a data operation is performed on a predetermined or current block. In operation S22, it is determined whether the data operation has been successfully performed on the predetermined block.

Specifically, referring to FIG. 4A, the data operation is performed on a block 21 of a flash memory, and then it is determined whether the data operation has been successfully performed on the block 21 of the flash memory.

If the data operation is determined unsuccessful, then in operation S23 the predetermined block is determined defective and then registered with the mapping table.

In operation S24, the predetermined block is mapped with a substitute block in the spare area 12. In operation S25, a data operation, which is supposed to be performed on the predetermined block, is performed on the substitute block.

Specifically, referring to FIG. 4B, data stored in the block 21 in the data area 20 is transferred to a block 12a in the spare area 12.

Then, a data operation, which is supposed to be performed on the block 21 in the data area 20, is performed on the block 12a in the spare area 12 by referencing the mapping table specifying that the block 21 in the data area 20 is replaced with the block 12a in the spare area 12.

For example, if a defect occurs while writing data on the block 21 in the data area 20, part of the data that has been written on the block 21 is transferred from the block 21 to the block 12a in the spare area 12.

In addition, when a data operation is again performed on the block 21, the rest of the data is written on the block 12a in the spare area 12 by referencing the mapping table.

Thereafter, in operation S26, it is determined whether the data operation is complete. Unless the data operation is complete, operations S21 through S25 are repeatedly performed.

However, the above conventional data management methods of a flash memory can only be applied to a single flash memory and thus are not suitable for a system using plural flash memory.

SUMMARY OF THE INVENTION

The present invention provides a data management apparatus and method of a flash memory, which can efficiently deal with defective blocks in each flash memory in a system using one or more flash memory.

The above stated object as well as other objects, features and advantages, of the present invention will become clear to those skilled in the art upon review of the following description, the attached drawings and appended claims.

According to an exemplary embodiment of the present invention, there is provided a data management apparatus comprising a device driver, which controls the operation of one or more flash memories, and a controller, which transfers data stored in a defective block of one of the flash memories (to be referred to as first flash memory) to a predetermined block in the first flash memory.

When performing a data operation in a multi-channel manner, the controller may transfer data, which is stored in a block of the other flash memory (to be referred to as second flash memory) having the same offset value as the defective block of the first flash memory, to a predetermined block of each flash memory.

When performing a data operation in an interleaved manner, the controller may generate an upper block by combining together blocks of flash memories having the same offset value.

The controller may replace the defective block of the first flash memory with the predetermined block of the first flash memory to then allow the predetermined block to be included in the upper block.

According to another exemplary embodiment of the present invention, there is provided a data management method of a flash memory comprising identifying a defective block that has occurred in one or more flash memories (to be referred to as first flash memory), and transferring data stored in the defective block to a predetermined block in the first flash memory.

When performing the data operation on the predetermined block, the identifying operation may comprise identifying a block of the first flash memory as the defective block depending on whether the data operation has been successfully performed on the predetermined block of the first flash memory.

When performing the data operation in a multi-channel manner, the transferring operation may comprise transferring data, which is stored in a block of another flash memory (to be referred to as second flash memory), having the same offset value as the defective block of the first flash memory, to a predetermined block of each flash memory.

When performing the data operation in an interleaved manner, the transferring operation may comprise generating an upper block by combining together blocks of flash memories having the same offset value.

In addition, the transferring operation may comprise replacing the defective block of the first flash memory with the non-defective block of the first flash memory, and allowing the predetermined block to be included in the upper block.

BRIEF DESCRIPTION OF THE DRAWINGS

The above and other features and advantages of the present invention will become more apparent by describing in detail exemplary embodiments thereof with reference to the attached drawings in which:

FIG. 7 is a block diagram of a data management apparatus of a flash memory, according to an exemplary embodiment of the present invention;

FIGS. 14A and 14B are diagrams illustrating mapping tables, which respectively map defective blocks in a flash memory with substitute blocks in a spare area of the flash memory;

DETAILED DESCRIPTION OF THE PREFERRED EMBODIMENTS

Figure 1:
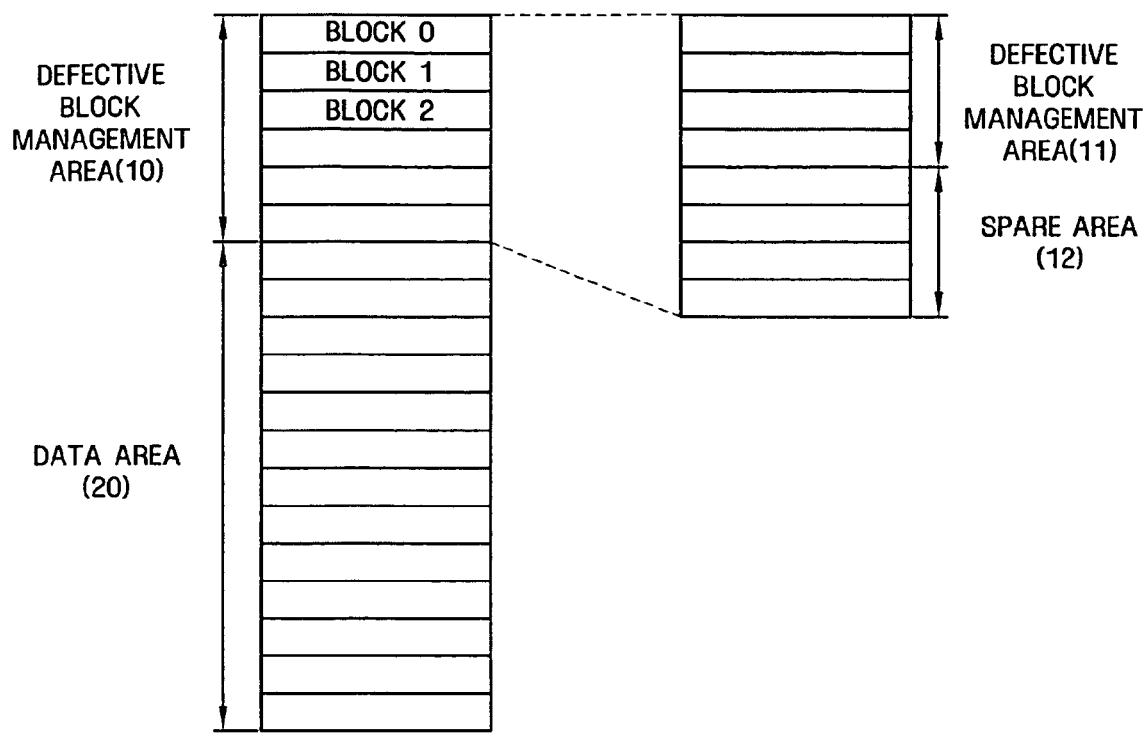
FIG. 1 is a schematic diagram of a typical flash memory.
Figure 2:
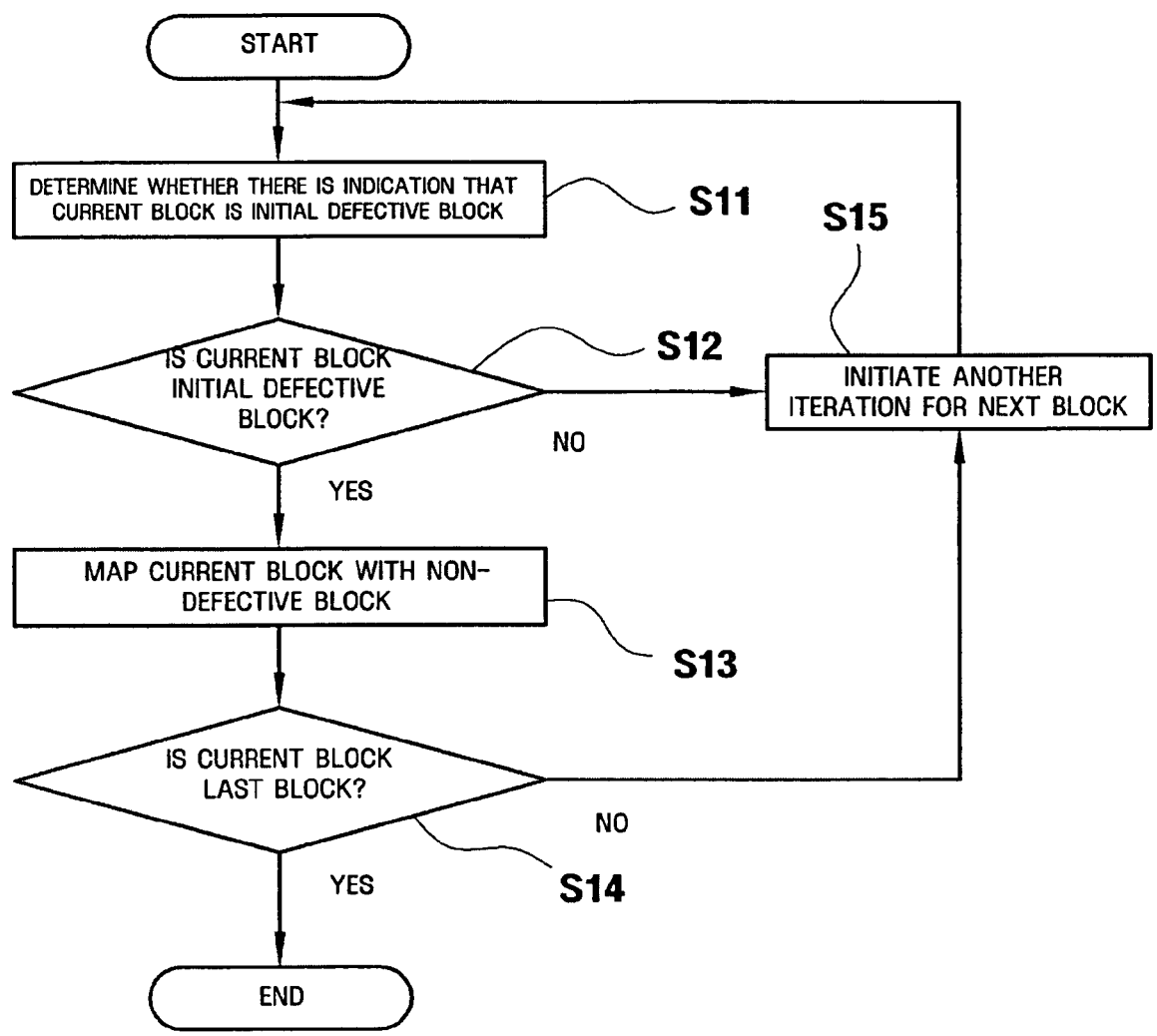
FIG. 2 is a flowchart of a conventional data management method that deals with initial defective blocks in a flash memory.
Figure 3:
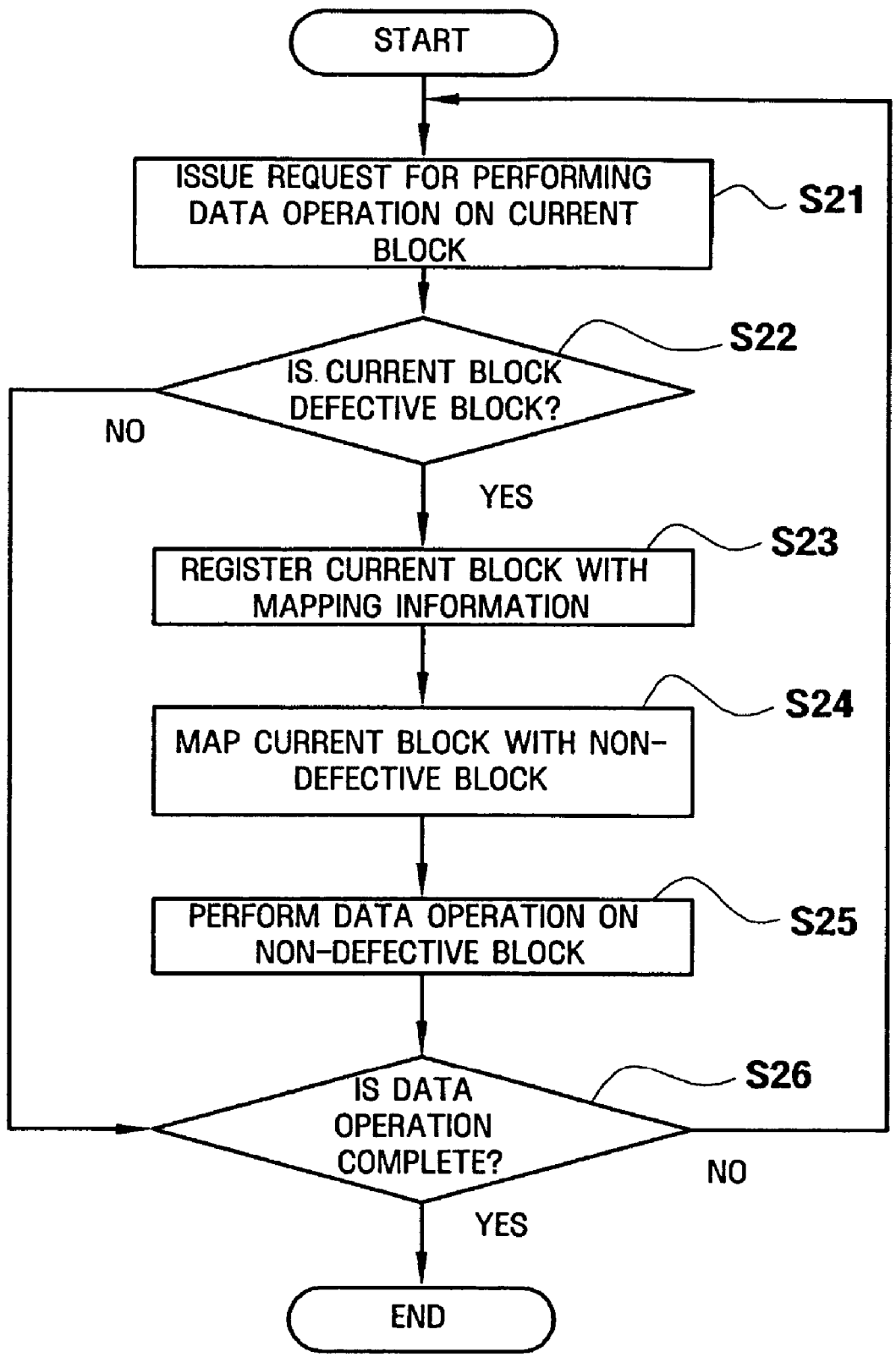
FIG. 3 is a flowchart of a conventional data management method that deals with run-time defective blocks in a flash memory.
Figure 4A:
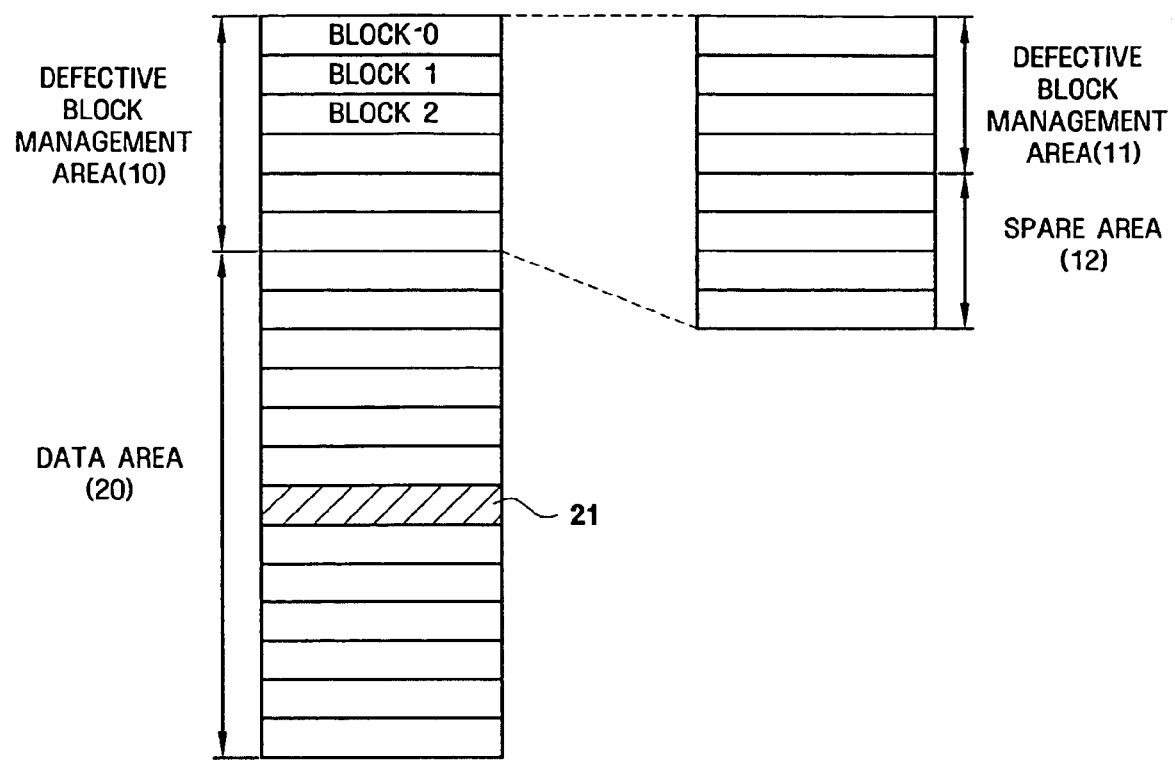
FIG. 4A is a diagram illustrating a data operation performed on a typical flash memory.
Figure 4B:
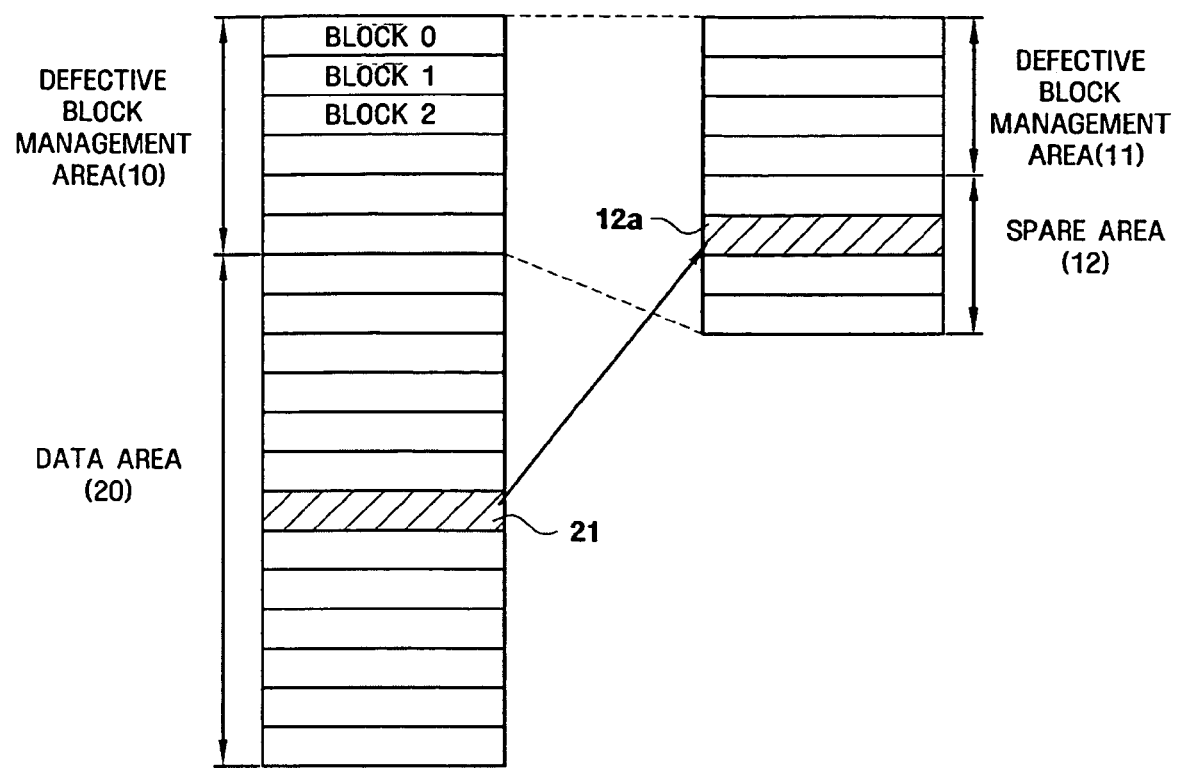
FIG. 4B is a diagram illustrating a method of transferring data stored in a run-time defective block in a data area of a typical flash memory to a substitute block in a spare area of the typical flash memory.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which exemplary embodiments of the invention are shown.

Recently, the performance of a system using one or more flash memories has been improved by adopting a multi-channel or interleaved approach.

In a multi-channel approach, the flash memories share a control line with one another, and thus data can be written in parallel on the flash memories at the same time.

Figure 5A:
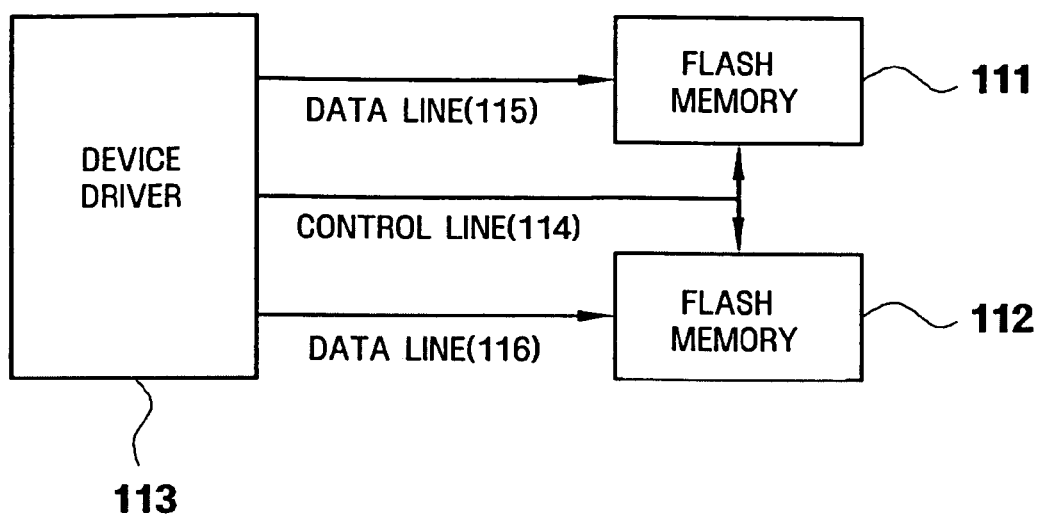
FIG. 5A is a block diagram of a typical multi-channel system using at least one flash memory.

Specifically, referring to FIG. 5A, two flash memories 111 and 112 and a device driver 113, which controls the flash memories 111 and 112, share a control line 114. The flash memories 111 and 112 use different data lines, i.e., the flash memories 111 and 112 use data lines 115 and 116, respectively.

Therefore, the multi-channel approach enables m flash memories each comprised of n bits (where m and n are integers) to be operated as if there were only one flash memory, by making the m flash memories share m×n buses with one another.

Figure 5B:
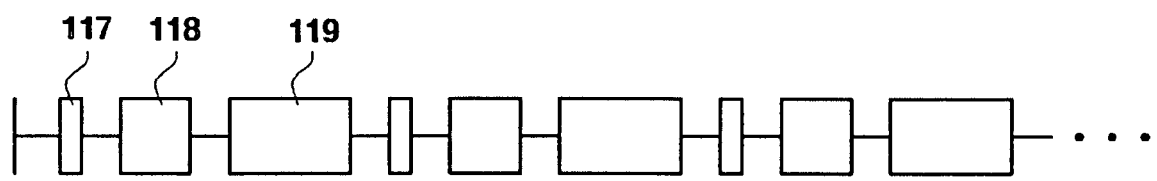
FIG. 5B is a diagram illustrating a typical data operation performed in the typical multi-channel system of FIG. 5A.

Referring to FIG. 5B, which illustrates the operation of the typical multi-channel system of FIG. 5A, a control signal, including a data computation command and an address at which a data operation is to be performed, is transmitted (117) to the flash memory 112 and to the flash memory 113 at the same time because the flash memories 112 and 113 share the control line 114 with each other.

Since the flash memories 112 and 113 use the data lines 115 and 116, respectively, data can be respectively loaded (118) in the flash memory 112 and in the flash memory 113 at the same time, and the data operation can be performed (119) on the flash memory 112 and the flash memory 113 at the same time.

Complete data, which is supposed to be recorded in an entire flash memory unit comprised of the flash memories 112 and 113, is obtained by summing up the data respectively loaded in the flash memories 112 and 113.

In an interleaved manner, a plurality of flash memories share a data line with one another. Specifically, in the case of performing multiple write operations, data is loaded in a first flash memory, and then other data is loaded in a second flash memory while loading data in the first flash memory.

Figure 6A:
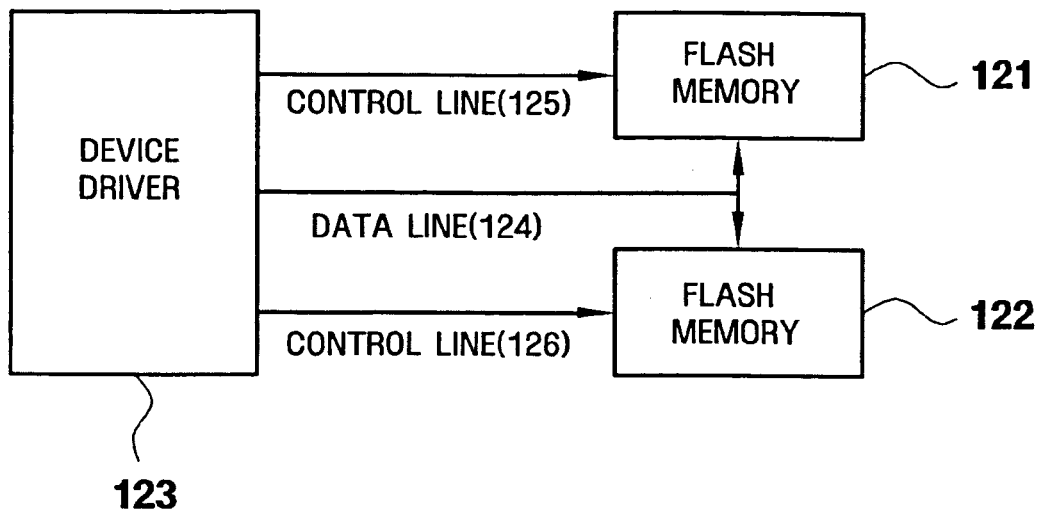
FIG. 6A is a block diagram of a typical interleaved system using one or more flash memories.

Referring to FIG. 6A, which illustrates a typical interleaved system using one or more flash memories, two flash memories 121 and 122 and a device driver 123, which controls the two flash memories 121 and 122, share a data line 124 with one another. The flash memories 121 and 122 use separate control lines, i.e., the flash memories 121 and 122 use control lines 125 and 126, respectively.

Figure 6B:
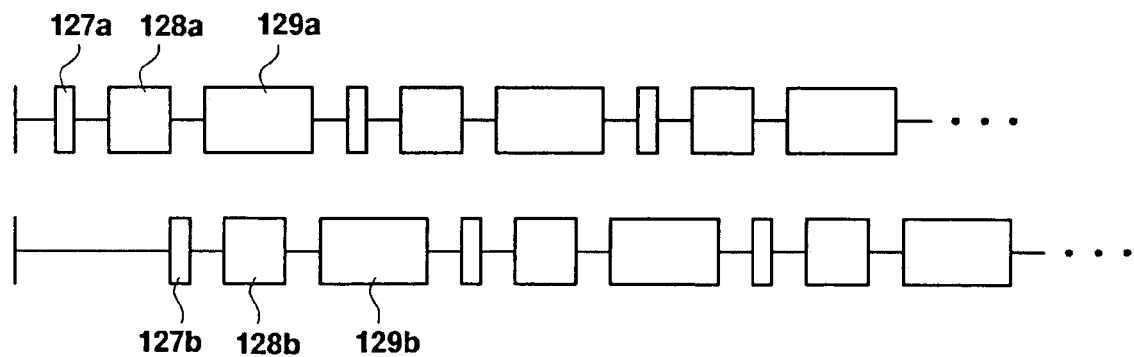
FIG. 6B is a diagram illustrating a typical data operation performed in the typical interleaved system of FIG. 6A.

Referring to FIG. 6B, which illustrates the operation of the typical interleaved system of FIG. 6A, a control signal, including a data computation command and an address at which a first data operation is to be performed is transmitted (127a) to, for example, the first flash memory, data is loaded (128a) in the first flash memory, and the first data operation is performed (129a) on the first flash memory. While the first data operation is being performed (129a) on the first flash memory, another control signal, including a data computation command and an address at which a second data operation is to be performed, is transmitted (127b) to, for example, the second flash memory, another data is loaded (128b) in the second flash memory, and the second data operation is performed (129b) on the second flash memory.

A data management apparatus according to an exemplary embodiment of the present invention will now be described more fully with reference to FIG. 7. The data management apparatus can guarantee the stability of data stored in a plurality of flash memories and can efficiently deal with defective blocks in each of the flash memories. Referring to FIG. 7, the data management apparatus includes a plurality of flash memories, i.e., flash memories 210, 220, and 230, a device driver 300, which controls the operation of each of the flash memories 210, 220, and 230, and a controller 400, which transfers data stored in a defective block in any of the flash memories 210, 220, and 230 to a non-defective block in a corresponding flash memory.

The data management apparatus according to the exemplary embodiment of the present invention will now be described by taking examples of a multi-channel system using one or more flash memories and an interleaved system using one or more flash memories.

Figure 8:
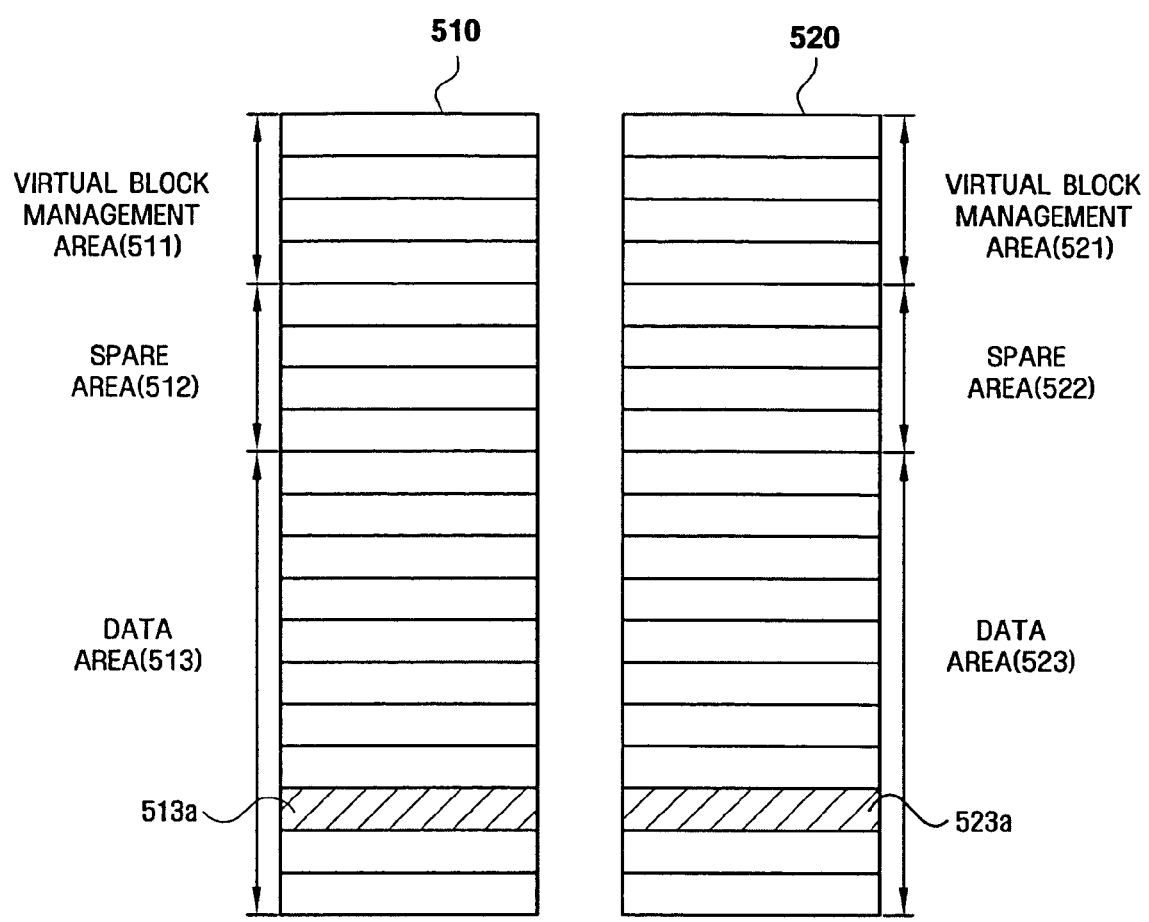
FIG. 8 is a diagram illustrating a data operation performed in a multi-channel system using one or more flash memories, according to an exemplary embodiment of the present invention.

Referring first to FIG. 8, flash memories 510 and 520 include virtual block management areas 511 and 521, respectively, spare areas 512 and 522, respectively, and data areas 513 and 523, respectively. Each of the virtual block management areas 511 and 521 includes mapping information of defective blocks in a corresponding flash memory. Each of the spare areas 512 and 522 includes substitute blocks, to which data stored in the defective blocks in the corresponding flash memory are respectively transferred. In each of the data areas 513 and 523, predetermined data operations are executed.

In the multi-channel approach, a data operation can be performed in parallel on the flash memories 510 and 520. Thus, if data exists in a block 513a of the flash memory 510, data also exists in a block 523a of the flash memory 520 that has the same offset value as the block 513a.

If a defect occurs in a block of one of the flash memories 510 and 520 (hereinafter referred to as a first flash memory), the controller 400 of the data management apparatus of FIG. 7 transfers data stored in the defective block of the first flash memory to a block in the spare area (512 or 522) of the first flash memory.

Thereafter, the controller 400 also transfers data, which is stored in a block of the other flash memory (hereinafter referred to as a second flash memory) that has the same offset value as the defective block of the first flash memory, to a block in the spare area of the second flash memory.

This is because the data stored in the defective block of the first flash memory may cause data loss by adversely affecting the data stored in the block of the second flash memory having the same offset value as the defective block of the first flash memory, due to the characteristics of the multi-channel approach.

Alternatively, flash memories 510 and 520 include virtual block management areas 511 and 521, respectively, spare areas 512 and 522, respectively, and data areas 513 and 523, respectively. Each of the virtual block management areas 511 and 521 includes mapping information on defective blocks in a corresponding flash memory. Each of the spare areas 512 and 522 includes substitute blocks, to which data stored in the defective blocks in the corresponding flash memory are respectively transferred. Predetermined data operations are executed in each of the data areas 513 and 523.

Figure 9:
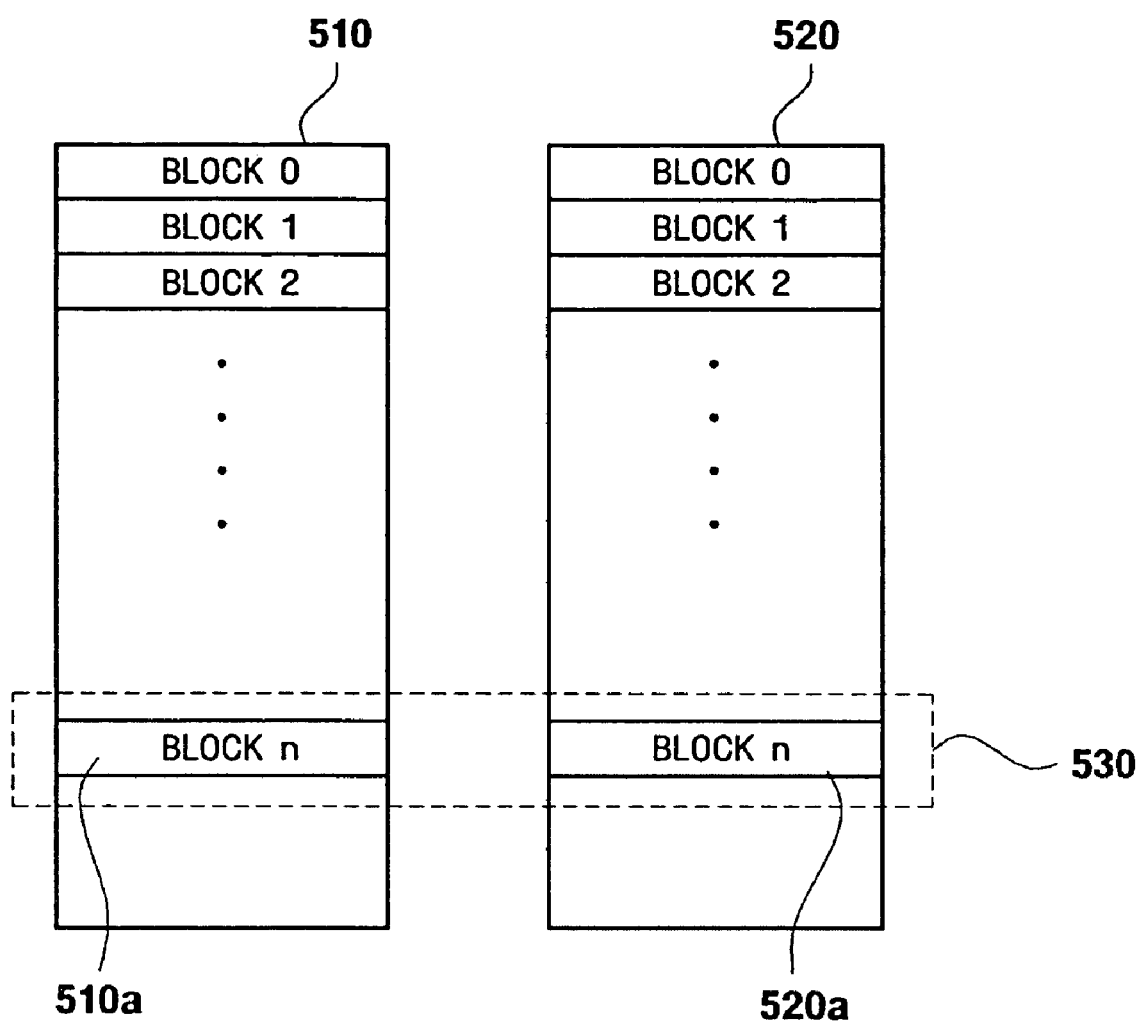
FIG. 9 is a diagram illustrating a data operation performed in an interleaved system using one or more flash memories, according to an exemplary embodiment of the present invention.

In addition, as shown in FIG. 9, the controller 400 forms an upper block 530 by combining together a block 510a of the flash memory 510 and a block 520a of the flash memory 520, which have the same offset value.

Figure 10:
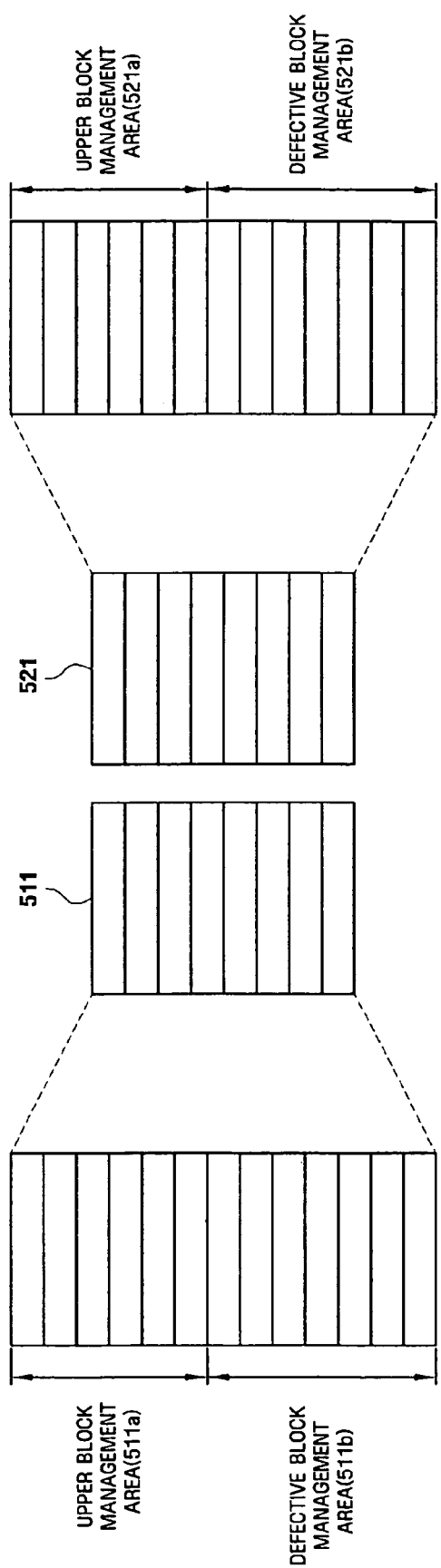
FIG. 10 is a diagram illustrating virtual block management areas of FIG. 9.
Figure 11:
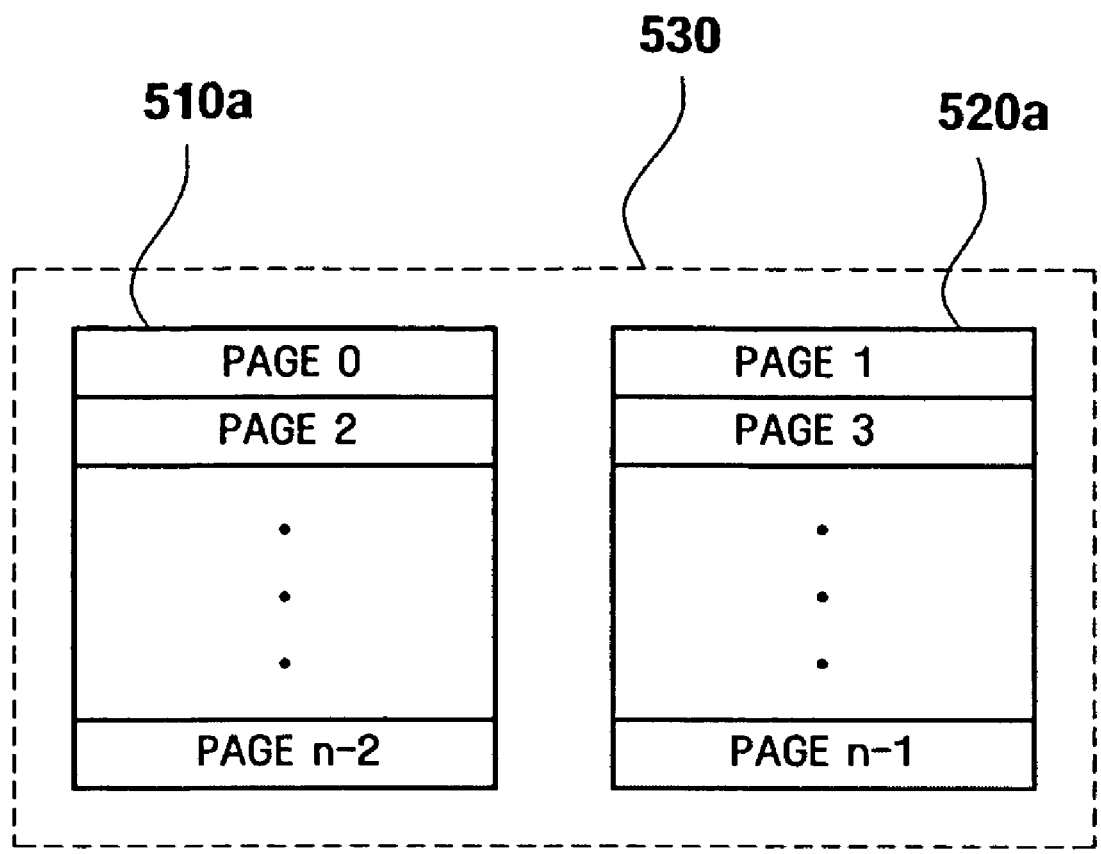
FIG. 11 is a diagram illustrating a data operation performed on an upper block of FIG. 9.

Here, as shown in FIG. 10, the virtual block management areas 511 and 521 include upper block management areas 511a and 521a, respectively, and defective block management areas 511b and 521b, respectively. Each of the upper block management areas 511a and 521a includes information on the upper block 530. Each of the defective block management areas 511b and 521b is comprised of a mapping table that respectively maps defective blocks in the data area of a corresponding flash memory with non-defective blocks in the spare area of the corresponding flash memory.

Thus, the controller 400 performs a data operation, which is supposed to be sequentially performed on the block 510a of the flash memory 510 and on the block 520a of the flash memory 520, on the upper block 530 by referencing the information on the upper block 530 stored in each of the upper block management areas 511a and 521a. Obviously, it is more convenient to perform the data operation on the upper block 530 than to perform the data operation on the block 510a of the flash memory 510 and then on the block 520a of the flash memory 520.

In this case, according to the interleaved manner, if a defect occurs in a block of one of the flash memories 510 and 520 (hereinafter referred to as first flash memory) data stored in the defective block of the first flash memory is transferred to a non-defective block in the spare area (512 or 522) of the first flash memory.

Then, an upper block is generated by combining the non-defective block in the spare area of the first flash memory with a predetermined block of the other flash memory (hereinafter referred to as second flash memory).

As described above, information on the non-defective block in the spare area of the first flash memory and the predetermined block of the second flash memory, which forms the upper block together with the non-defective block in the spare area of the first flash memory, is stored in each of the upper block management areas 511a and 521a.

Thus, a data operation, which is supposed to be performed on the upper block comprised of the defective block of the first flash memory and the predetermined block of the second flash memory, can be performed on the upper block comprised of the non-defective block in the spare area of the first flash memory and the predetermined block of the second flash memory by referencing the information stored in each of the upper block management areas 511a and 521a.

A data management method of a system using one or more flash memories, according to an exemplary embodiment of the present invention will be described more fully.

Figure 12:
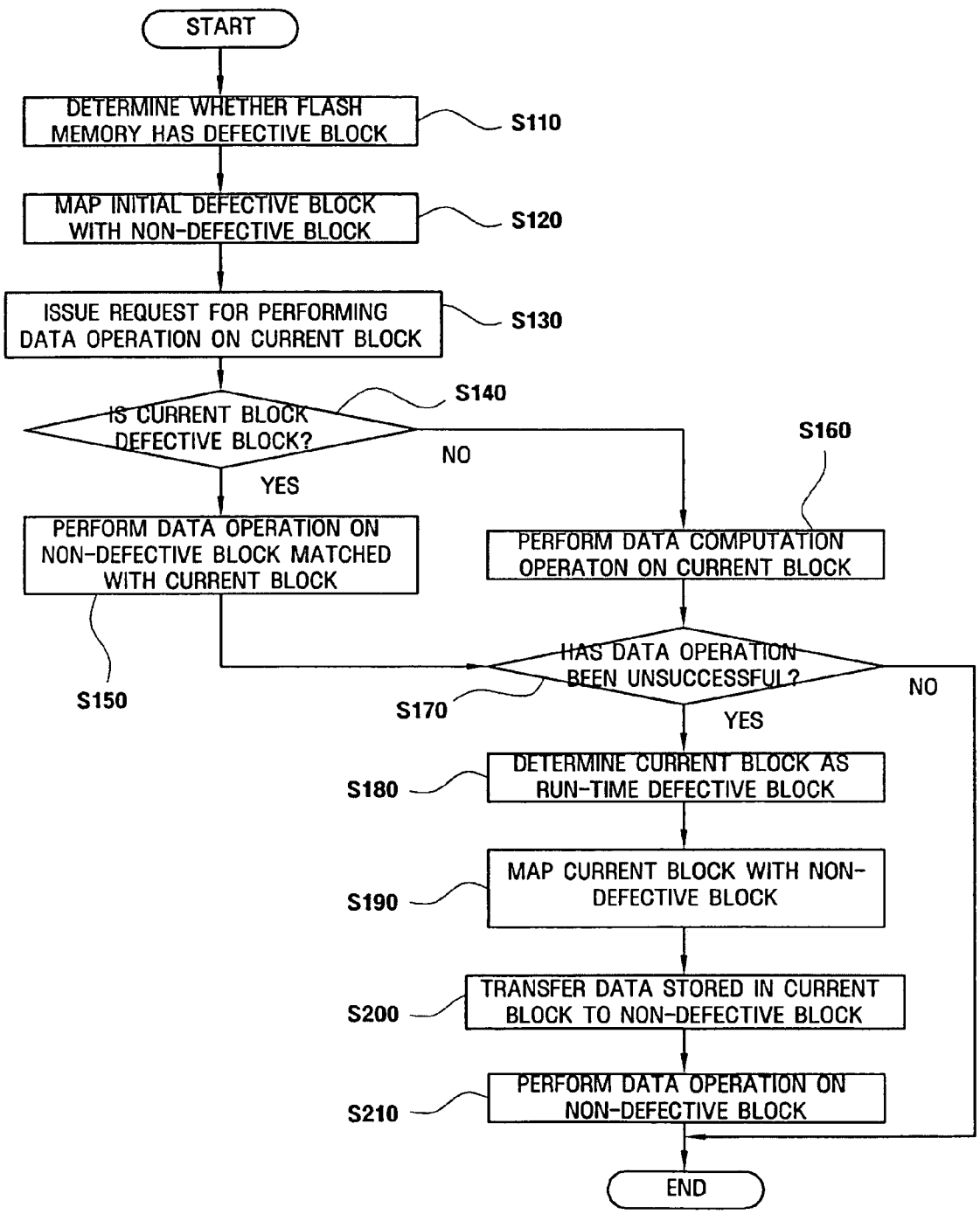
FIG. 12 is a flowchart of a data management method of a flash memory, according to an exemplary embodiment of the present invention.

Referring to FIG. 12, in operation S110, it is determined whether each of the flash memories in the system has initial defective blocks.

Here, the initial defective blocks are defective blocks detected before a flash memory is shipped out of the factory. In operation S120, a mapping table is generated by identifying the initial defective blocks in each of the flash memories in the system.

The mapping table matches the initial defective blocks in the flash memories in the system with non-defective blocks in spare areas of the respective flash memories and is stored in a virtual block management area in each of the flash memories so that a data operation, which is supposed to be performed on the initial defective blocks of the corresponding flash memory, can be performed on the non-defective blocks in the spare area of the corresponding flash memory.

Figure 13:
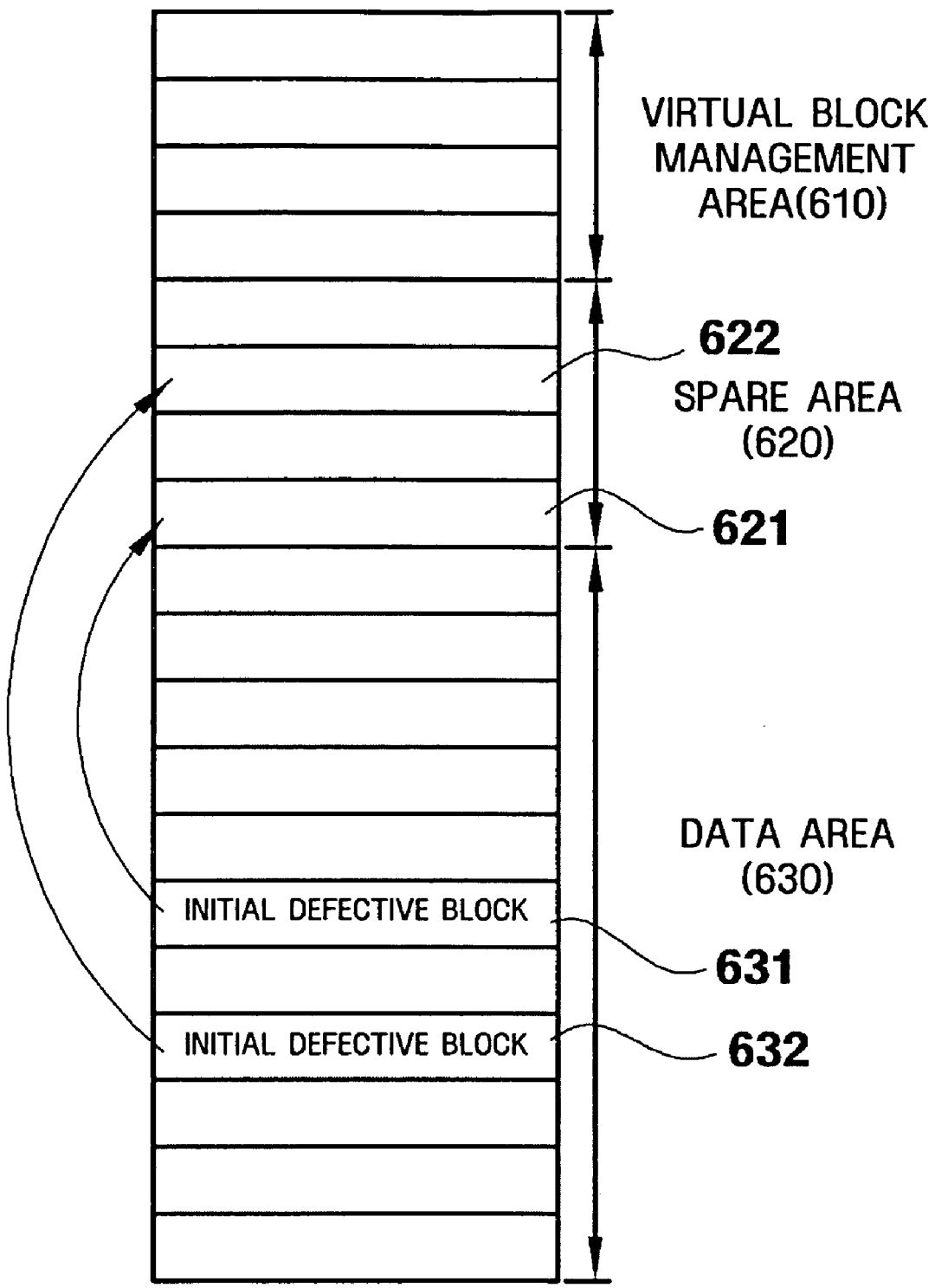
FIG. 13 is a diagram illustrating a method of dealing with initial defective blocks of a flash memory, according to an exemplary embodiment of the present invention.

Referring to FIG. 13, reference numerals 631 and 632 denote initial defective blocks generated in a data area 630.

Specifically, the initial defective blocks 631 and 632 are respectively mapped with non-defective blocks 621 and 622 of a spare area 620 so that a data operation can be performed on the non-defective blocks 621 and 622, rather than on the initial defective blocks 631 and 632.

A mapping table that respectively maps the initial defective blocks 631 and 632 with the non-defective blocks 621 and 622 is stored in a virtual block management area 610.

The mapping table may respectively match addresses of the non-defective 621 and 622 with addresses of the initial defective blocks 631 and 632, as shown in FIG. 14A. Alternatively, the mapping table may respectively match offset values assigned to the non-defective blocks 621 and 622 with the addresses of the initial defective blocks 631 and 632, as shown in FIG. 14B.

In operation S130, a user issues a request for performing a data operation on a predetermined or current block of one of the flash memories (hereinafter referred to as first memory). In operation S140, it is determined whether the predetermined block is an initial defective block by determining whether the predetermined block is included in the mapping block.

In operation S150, if the predetermined block turns out to be an initial defective block, a data operation is performed on a non-defective block in a spare area of the first flash memory, rather than on the predetermined block.

In operation S160, if the predetermined block turns out to be a non-defective block, the data operation is performed on the predetermined block. In operation S170, it is determined whether a defect has occurred in the predetermined block in the process of performing the data operation on the predetermined block.

If a defect has occurred in the predetermined block while performing the data operation on the predetermined block, then in operation S180 the predetermined block is determined to be a run-time defective block.

In operation S190, the predetermined block is registered with the mapping table so that it can be matched with a non-defective block in the spare area of the first flash memory.

In operation S200, data stored in the predetermined block is transferred to the non-defective block in the spare area of the first flash memory. In operation S210, a data operation is performed on the non-defective block in the spare area of the first flash memory, rather than on the predetermined block.

If the system is an interleaved system, the data operation is performed on an upper block, which is comprised of the non-defective block in the spare area of the first flash memory and a block in the other flash memory that has the same offset value as the non-defective block in the spare area of the first flash memory.

A method of transferring data stored in a defective block in each flash memory of a system to a non-defective block in a spare area of a corresponding flash memory will now be described in further detail.

Figure 15:
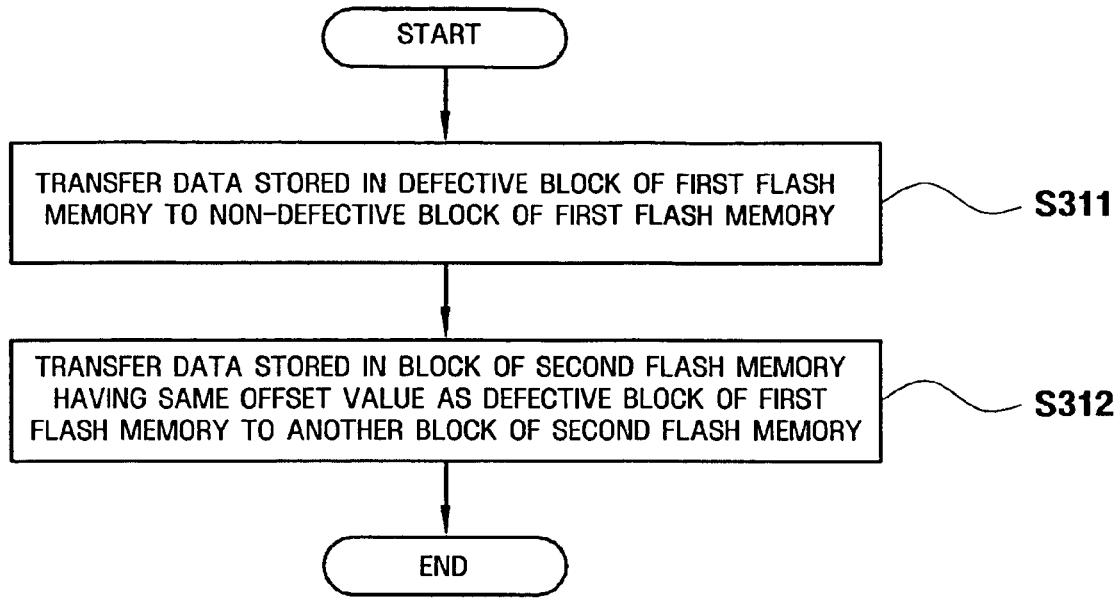
FIG. 15 is a flowchart of a method of dealing with run-time defective blocks of one or more flash memories in a multi-channel system, according to an exemplary embodiment of the present invention.

Referring to FIG. 15, in operation S311, data stored in a defective block in one of the flash memories (hereinafter, referred to as first flash memory) is transferred to a non-defective block, in a spare area of the first flash memory.

In operation S312, data, which is stored in a block of the other flash memory (hereinafter, referred to as second flash memory) that has the same offset value as the defective block in the first flash memory, is also transferred to a non-defective block in a spare area of the second flash memory.

Figure 16:
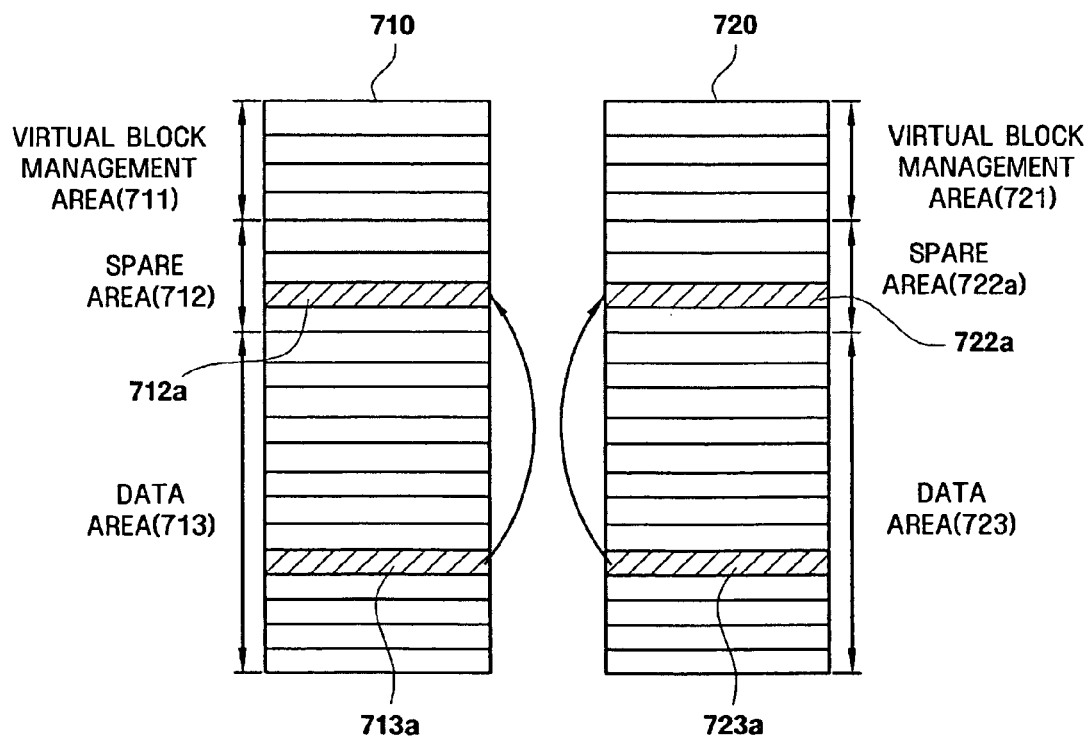
FIG. 16 is a diagram illustrating a method of transferring data stored in a run-time defective block in one or more flash memories in a multi-channel system to a block in a spare area of a corresponding flash memory.

Specifically, referring to FIG. 16, flash memories 710 and 720 include data areas 713 and 723, respectively. When a defect occurs in a block 713a in the flash memory 710, data stored in the defective block 713a is transferred to a non-defective block 712a in a spare area 712 of the flash memory 710.

A mapping table that matches the defective block 713a with the non-defective block 712a in the spare area 712 is stored in a virtual block management area 711.

Given that in the multi-channel system, a data operation is performed in parallel, data, which is stored in a block 723a of the flash memory 720 that has the same offset value as the defective block 713a of the flash memory 710, is also transferred to a block 722a in a spare area 722 of the flash memory 720.

In addition, a mapping table that matches the block 723a in the data area 723 with the block 722a in the spare area 722 is stored in a virtual block management area 721.

Figure 17:
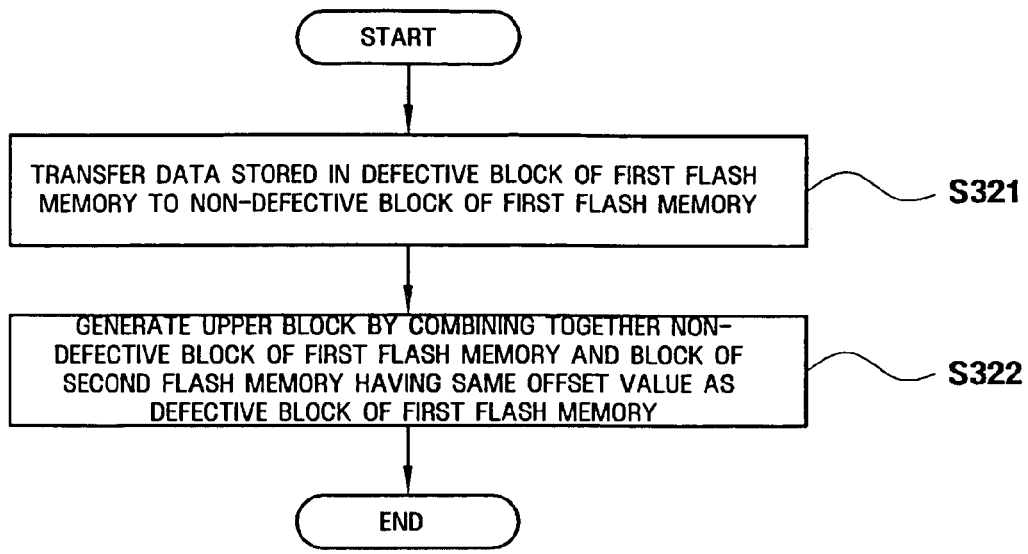
FIG. 17 is a flowchart of a method of dealing with run-time defective blocks in one or more flash memories in an interleaved system, according to an exemplary embodiment of the present invention.

Alternatively, referring to FIG. 17, in operation S321, data stored in a defective block in one of the flash memories (hereinafter referred to as first flash memory) is transferred to a non-defective block in a spare area of the first flash memory.

In operation S322, an upper block is generated by combining the non-defective block in the spare area of the first flash memory with a block of the other flash memory (hereinafter, referred to as second flash memory) having the same offset value as the defective block of the first flash memory.

Figure 18:
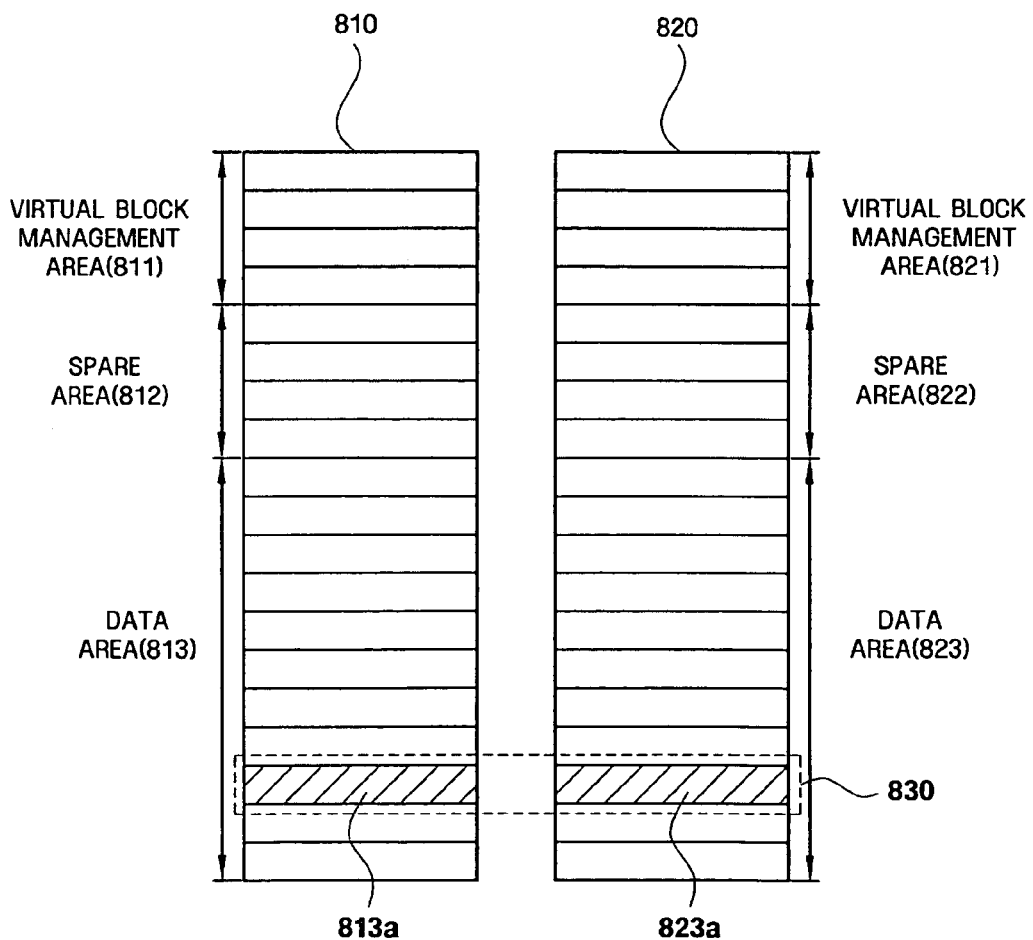
FIG. 18 is a diagram illustrating a data operation performed in an interleaved system using one or more flash memories, according to another exemplary embodiment of the present invention.
Figure 19:
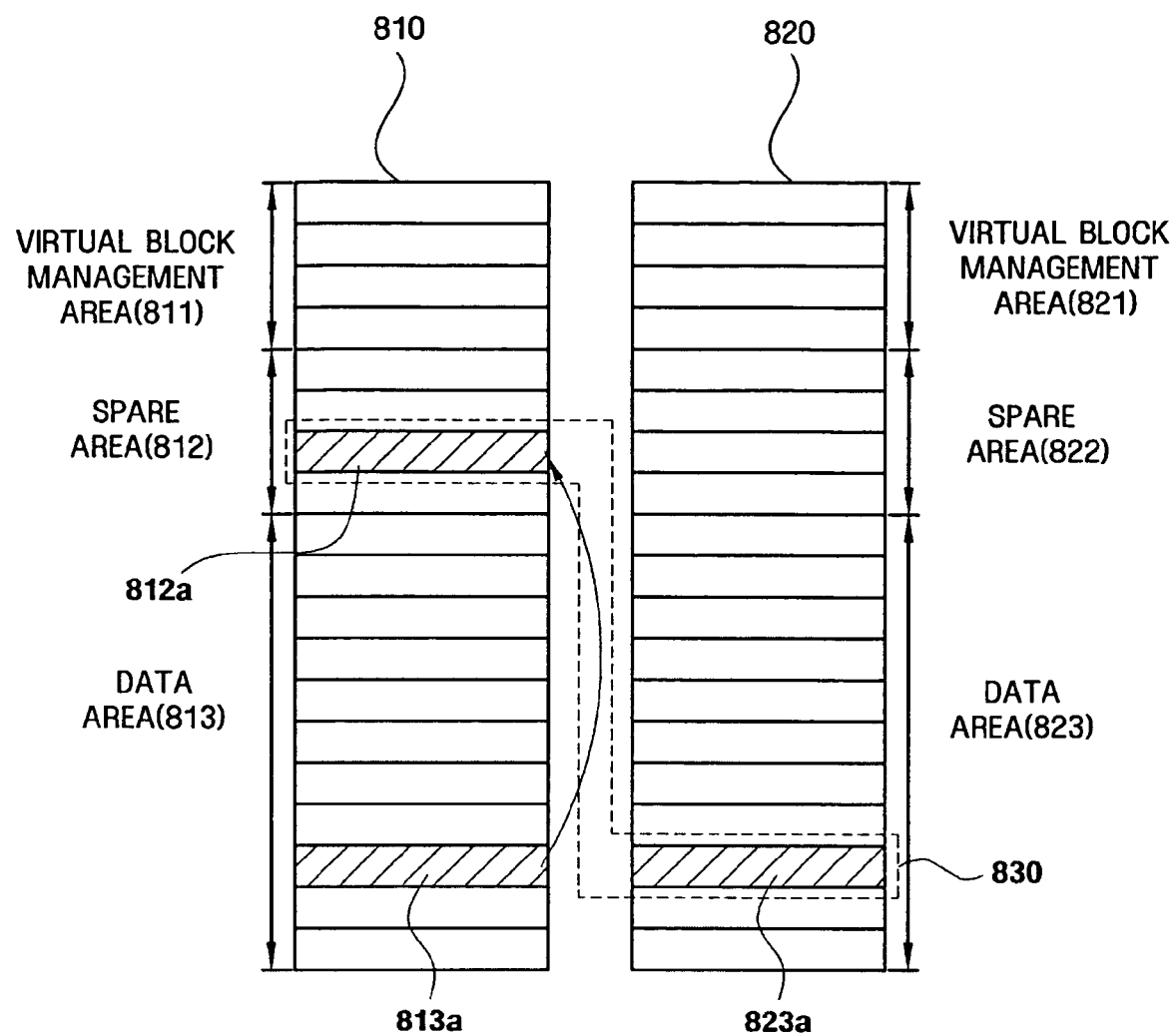
FIG. 19 is a diagram illustrating a method of transferring data stored in a run-time defective block in one or more flash memories in an interleaved system to a block in a spare area of a corresponding flash memory.

Specifically, referring to FIG. 18, flash memories 810 and 820 have no defective blocks. Blocks 813a and 823a of the flash memories 810 and 820, which have the same offset value, are integrated into an upper block 830. Information on the upper block 830 is stored in virtual block management areas 811 and 821 of the flash memories 810 and 820. 118 Referring to FIG. 19, if a defect occurs in the block 813a of the flash memory 810, data stored in the block 813a is transferred to a non-defective block 812a in a spare area 812 of the flash memory 810.

Thereafter, the non-defective block 812a in the spare area 812 of the flash memory 810 and the block 823 of the flash memory 820 are integrated into an upper block 830.

Information on the upper block is stored in the virtual block management areas 811 and 821 of the flash memories 810 and 820.

While the data management apparatus and method of a flash memory have been described with reference to the illustrative embodiments and drawings, it is to be appreciated that the above described embodiment is for purposes of illustration only and not to be construed as a limitation of the invention, and all variations and equivalents which fall within the range of the claims are intended to be embraced therein.

As described above, the data management apparatus and method according to the present invention have the following advantages.

First, it is possible to efficiently prevent the performance of a system using one or more flash memories from deteriorating due to defective blocks therein.

Second, it is possible to provide a system with an optimal data management method by using various methods depending on how the system manages data stored in each of the flash memories when dealing with defective blocks in each of the flash memories.

What is claimed is:

1. A data management apparatus comprising:
   a device driver for controlling at least one flash memory; and
   a controller for transferring data stored in a defective block of one of the at least one flash memory to a predetermined different block of said one flash memory,
   wherein there are at least first and second flash memories, wherein said one flash memory is the first flash memory; and wherein said controller transfers data stored in a block of the second flash memory that has the same offset value as the defective block of the first flash memory, to a predetermined block of said second flash memory.

2. The data management apparatus of claim 1, wherein an offset value of the predetermined different block of the first flash memory and an offset value of the predetermined block of said second flash memory are the same.

3. A data management apparatus comprising:
   a device driver for controlling at least one flash memory; and
   a controller for transferring data stored in a defective block of one of the at least one flash memory to a predetermined different block of said one flash memory,
   wherein there are a plurality of flash memories, and wherein said controller generates an upper block by combining together blocks of flash memories having a same offset value.

4. The data management apparatus of claim 3, wherein the controller replaces the defective block of the one flash memory with the predetermined block of the one flash memory and then allows the predetermined block to be included in the upper block.

5. A data management method of a flash memory comprising:
   identifying a defective block that has occurred in at least one first flash memory; and
   transferring data stored in the defective block to a predetermined block in the first flash memory,
   wherein when transferring data on the predetermined block, identifying a block of the first flash memory as the defective block depending on whether the data operation has been successfully performed on the predetermined block of the first flash memory,
   wherein the data transfer is performed in a multi-channel manner, and wherein there is a second flash memory, and wherein data is transferred from the second flash memory from a block having the same offset value as the defective block of the first flash memory, to a predetermined block of said second flash memory.

6. A data management method of a flash memory comprising:
identifying a defective block that has occurred in at least one first flash memory; and
transferring data stored in the defective block to a predetermined block in the first flash memory,
wherein when transferring data on the predetermined block, identifying a block of the first flash memory as the defective block depending on whether the data operation has been successfully performed on the predetermined block of the first flash memory, and
data is transferred in an interleaved manner, and wherein an upper block is generated by combining together a block of the first flash memory and a block of a second flash memory having the same offset value.

7. The data management method of claim 6, wherein data is transferred by:
replacing the defective block of the first flash memory with the non-defective block of the first flash memory; and
allowing the predetermined block to be included in the upper block.

8. A data management apparatus comprising first and second flash memories, each having a plurality of memory blocks; a controller for transferring data stored in a defective memory block of said first flash memory to a predetermined different memory block of said first flash memory, and for transferring data stored in a memory block of said second flash memory to a predetermined different memory block of said second flash memory,
wherein said controller transfers data stored in the block of the second flash memory that has the same offset value as the defective block of the first flash memory, to the predetermined memory block of said second flash memory.

9. The data management apparatus of claim 8, wherein the memory block of said second flash memory is not defective.

10. The data management apparatus of claim 8, wherein said controller determines if each memory block of said first and second flash memories is defective.

11. The data management apparatus of claim 10, wherein said controller determines if each of the memory blocks contains a run-time defect.

12. The data management apparatus of claim 10, wherein said controller determines if each of the memory blocks contains an initial defect.

13. The data management apparatus of claim 10, wherein said controller performs a data operation on at least one of the predetermined different memory blocks of said first and second flash memories.

14. The data management apparatus of claim 10, wherein data is transferred in an interleaved manner.

15. The data management apparatus of claim 10, wherein data is transferred in a multi-channel manner.

16. A data management apparatus comprising:
a device driver for controlling a first flash memory and a second flash memory; and
a controller for transferring data stored in a defective block of one of the first and the second flash memories to a predetermined different block of the one of the first and the second flash memories,
wherein the data transfer is performed in a multi-channel manner, and
wherein the controller transfers in parallel, the data to the first flash memory and a data to the second flash memory,
the data management apparatus further comprising a first data line of the first flash memory and a second data line of the second flash memory, wherein the data to the first flash memory is transferred through the first data line and the data to the second flash memory is transferred through the second data line.

17. A data management apparatus comprising:
a device driver for controlling a first flash memory and a second flash memory; and
a controller for transferring data stored in a defective block of one of the first and the second flash memories to a predetermined different block of the one of the first and the second flash memories,
wherein data is transferred in an interleaved manner, and
wherein the controller serially transfers the data to the first flash memory and a data to the second flash memory, and
the data management apparatus further comprising a first data line of the first flash memory and a second data line of the second flash memory, wherein the data to the first flash memory is transferred through the first data line and the data to the second flash memory is transferred through the second data line.

* * * * *